United States Patent [19]
Makosch

[11] Patent Number: 4,577,968
[45] Date of Patent: Mar. 25, 1986

[54] METHOD AND ARRANGEMENT FOR OPTICAL DISTANCE MEASUREMENT

[75] Inventor: Günter Makosch, Sindelfingen, Fed. Rep. of Germany

[73] Assignee: International Business Machines Corporation, Armonk, N.Y.

[21] Appl. No.: 694,576

[22] Filed: Jan. 24, 1985

Related U.S. Application Data

[63] Continuation of Ser. No. 288,426, Jul. 30, 1981, abandoned.

[30] Foreign Application Priority Data

Jul. 31, 1980 [DE] Fed. Rep. of Germany ............ 80104529[U]

[51] Int. Cl.$^4$ ............................................. G01B 9/02
[52] U.S. Cl. .................................... 356/356; 356/351
[58] Field of Search ............... 356/351, 354, 355, 356

[56] References Cited

U.S. PATENT DOCUMENTS 3,756,723  9/1973  Hock ............................ 356/351 X
3,849,003  11/1974 Velzel ........................... 356/353 X
3,891,321  6/1975  Hock ............................ 356/351 X
4,172,664  10/1979 Charsky et al. ................. 356/356
4,298,283  11/1981 Makosch et al. ................. 356/351

FOREIGN PATENT DOCUMENTS 2038500  7/1980  United Kingdom ............... 356/351

Primary Examiner—Davis L. Willis
Assistant Examiner—Matthew W. Koren
Attorney, Agent, or Firm—Jackson E. Stanland

[57] ABSTRACT

A method and apparatus is described for making absolute and relative distance measurements optically. A grating, or gratings, is located on the object whose displacement is to be measured, or on a surface in contact with the object. Two perpendicularly polarized light beams interact with the grating to produce a phase difference therebetween. This phase difference is a measure of the displacement of the object, and can be compensated for in order to determine the exact displacement of the object. The relative displacement between two objects can be measured in a similar way, there being gratings on the two objects. One of the light beams strikes one grating while the other strikes the second grating. If there is perfect alignment between the gratings on the two objects, there will be no phase difference in the diffracted light from the gratings. If there is misalignment between the objects, a phase difference between the diffracted signals will be produced indicative of this misalignment.

11 Claims, 9 Drawing Figures

METHOD AND ARRANGEMENT FOR OPTICAL DISTANCE MEASUREMENT

This is a continuation of Ser. No. 288,426 filed July 30, 1981, now abandoned.

DESCRIPTION

1. Technical Field

The invention concerns a method and apparatus for optical distance measurement by determining the phase shift of light upon its diffraction by displaced optical gratings.

2. Background Art

The measurement of relative or absolute lengths and displacements, respectively, is subject to ever increasing accuracy requirements in science and technology. An example of this is the photolithographic production of integrated circuits, for which structures of the order of 1 micrometer have to be resolved. For accurately positioning the semiconductor wafers (wafers) prior to exposure, it is therefore necessary to accurately align the relative position of existing structures and exposure masks down to fractions of a micrometer. To permit a high production throughput, such alignment must be effected very rapidly without making undue demands on the operating personnel.

Similar accuracy requirements also exist with regard to the absolute measurement of lengths, for example, when evaluating exposure masks.

Existing measuring methods using visual observation are not suitable for the submicron range, as they are too strongly dependent on the subjective assessment of the operator. This restriction also holds for interferometric methods using visual observation.

An increase in accuracy can be obtained by means of photoelectric signal evaluation. For this purpose, the measuring value used is the light intensity, for example, its sinusoidal variation in an interferometric measuring structure. The accuracy obtainable during the evaluation of this curve is limited by the fact that the light intensity is governed by a number of parameters of the measuring structure; thus, in many cases, it is only possible to determine the zero point, so that the measuring variable desired can only be determined with an accuracy which is of the order of the light wave used.

Such interferometric measuring systems are designed, for example, in such a manner that the length to be measured forms part of a Michelson interferometric structure. Further interferometric methods evaluating phase changes of light diffracted at a moved or displaced optical grating are described in the article "A New Interferometric Alignment Technique" by D. C. Flenders and H. I. Smith in Applied Physics Letters, Vol. 31, No. 7 (October 1977), page 426 and in the German Offenlegungsschrift No. 24 31 166. These methods are also used to evaluate the intensity of the interference phenomena, leading to the above-mentioned restrictions in accuracy.

Therefore, it is an object of the present invention to provide a method for optical distance measurement, the accuracy of which amounts to fractions of a micrometer, which is suitable for a plurality of measuring jobs, which can be rapidly implemented, and whose results are largely independent of the operator; it is a further object of this invention to provide arrangements for implementing said method, which are of a simple and stable design and which are adapted to different measuring jobs.

DISCLOSURE OF THE INVENTION

In accordance with the proposed method, the phase difference of two perpendicularly polarized partial beams is measured, where the phase difference is caused by the interaction of said partial beams with grating structures on the object to be measured. For accurately determining the relative position of two objects, the latter are provided with one optical grating each; the diffracted and perpendicularly polarized partial beams emanating from said gratings are optically combined to form one beam, and the phase difference, from which the lateral displacement of the two objects is obtained, is measured. For the absolute determination of the displacement of an object, the phase shift between different diffraction orders from gratings connected to the object during shifting, is measured.

For implementing this method, an arrangement is provided which consists of a basic instrument with exchangeable measuring heads which are adapted to the respective measuring jobs. For optically sensing the object to be measured and for optically recombining the partial beams, different measuring heads with birefringent materials are proposed. Signal evaluation is effected by electrooptical compensation of the phase difference in the recombined partial beams in the evaluation system, and is identical for all measuring heads.

The high accuracy obtainable by means of this method is based on the generation of partial beams (diffraction orders) polarized perpendicularly to each other, the phase difference between which can be measured extremely accurately by electrooptical compensation. The output signal of the electrooptical compensation device is an analogue sawtooth signal permitting a very good interpolation. Common signal evaluation for different measuring heads for sensing the object to be measured leads to an extremely versatile measuring device which is easy to operate.

The measuring accuracy obtainable is 0.02 $\mu$m or of the order of 1/1000 of the grating constant used; the measuring time is of the order of milliseconds and less. Also, the optical design of the measuring heads and the evaluation means is relatively simple; resolution and focussing problems are not encountered.

These objects, features, and advantages of the present invention will be more apparent from the following more detailed description of the preferred embodiments.

BEST MODE FOR CARRYING OUT THE INVENTION

Figure 1:
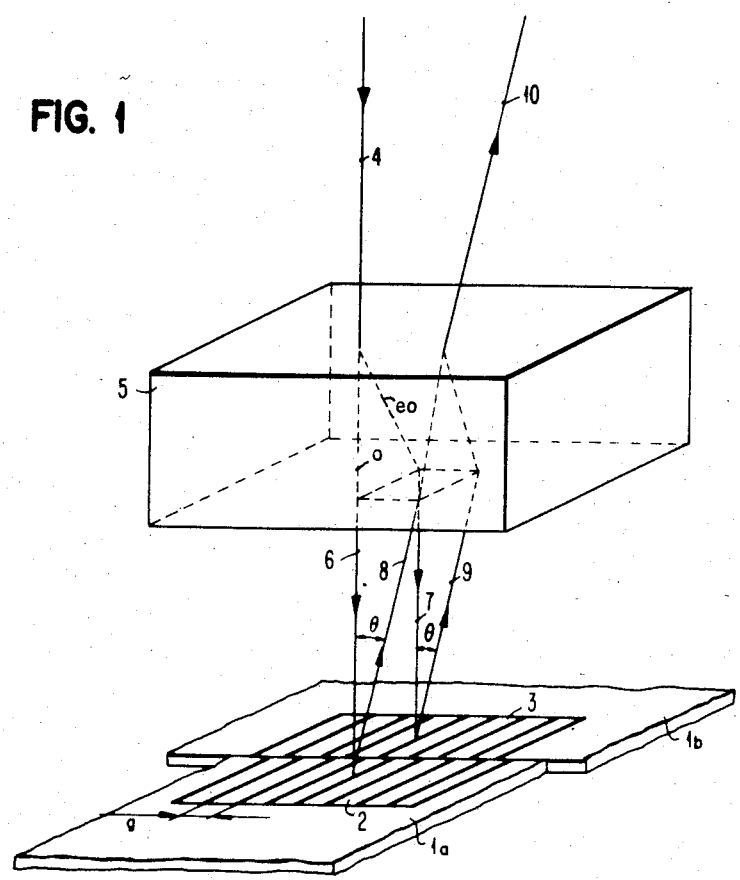
FIG. 1 is a schematic diagram of the measuring principle used to determine relative displacements, using two gratings.

FIG. 1 shows the principle of this method for the electrooptical measurement of the relative displacement of two objects 1a, 1b. Each of the objects is provided with a structure 2, 3 acting as an optical grating with a grating constant g, for example, by printing, scratching, imprinting, etc. If the two objects are ideally aligned, there is no stagger of these gratings when the grating directions are parallel.

For illuminating the two gratings 2, 3 by means of two beams 6, 7 polarized perpendicularly to each other, a light beam 4, e.g., a laser beam, is directed onto an optical birefringent crystal 5, e.g., calcite, where it is split into two partial beams: an ordinary (o) beam, and an extraordinary (eo) beam. Both partial beams leave the birefringent crystal 5 as parallel beams 6, 7, the directions of polarization of which are perpendicular to each other. The beams 6, 7 cover several grating periods, are diffracted at the two gratings 2 and 3, respectively, and generate several diffracted beams of different orders. FIG. 1 shows the respective first diffraction order which is marked by reference numerals 8 and 9, respectively, (the diffraction angles shown are not true to scale).

The beams 8, 9 diffracted at the gratings are returned to the birefringent crystal 5; the different diffraction of the ordinary and the extraordinary beam leads to the two reflected beams 8, 9 being recombined upon exciting from birefringent crystal 5, thus forming a common exit beam 10 with two partial beams polarized perpendicularly to each other.

The selection of the diffraction order to be observed in beam 10 is made by choosing the direction of observation in accordance with the diffraction angle $\theta$ $$\sin\theta_m = m\frac{\lambda}{g} \tag{1}$$

where
m = 0, ±1, ±2, etc., and
λ = wavelength of the light,
g = grating constant,
n = diffraction order.

For intensity reasons, preference is given to the first diffraction order (m=1).

If the two objects 1a, 1b are ideally aligned and have the same height, there is no phase difference between the two diffracted beams 8, 9 and thus there is no phase difference in the exit beam 10. However, a displacement of the two gratings relative to each other leads to a phase difference $\phi_m$. This phase difference can be very accurately measured by electrooptical compensation, thus constituting a measure of the faulty alignment of two objects 1a, 1b. Details of this phase measurement will be described by means of FIG. 2.

The measuring principle described above can also be used to test the accurate position reproducibility of successive manufacturing steps; for example, it can be used during the manufacture of semiconductors using several mask exposure steps. In such a case, a grating structure 2 and 3, respectively, is applied to a single semiconductor chip in each of the process steps to be tested, and the relative positions of the two gratings are compared in accordance with the method described above. A stagger of the gratings (so called overlay errors) may be attributable to alignment errors, imaging errors, temperature influence during manufacture, etc.

Figure 2A:
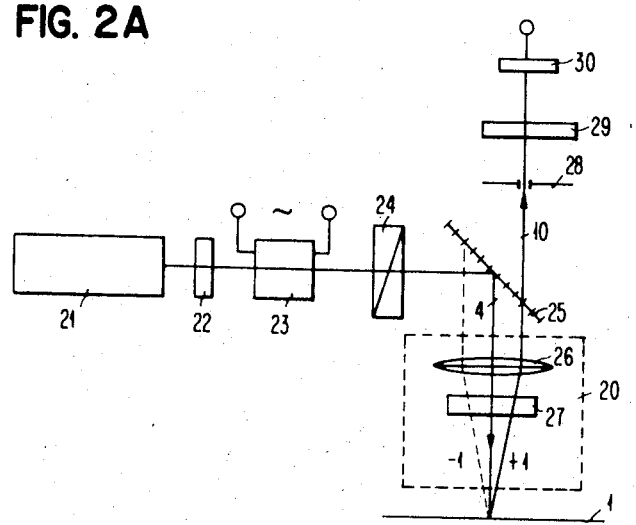
FIGS. 2A and 2B are schematic diagrams of two embodiments of the measuring apparatus for implementing the measuring method shown in principle in FIG. 1.

FIG. 2A is a schematic design of a measuring device for implementing the measuring technique shown in FIG. 1. It consists of a special measuring head 20 in which the input light beam is split in accordance with FIG. 1, as well as illumination and evaluation means. The illuminating beam 4 is generated by a laser 21 which is followed by a λ/2 plate 22, an electrooptical light modulator 23, a Soleil Babinet compensator 24, and an optical beam splitter 25. By means of the λ/2 plate 22 the direction of polarization of the laser light is rotated. In the electrooptical light modulator 23 the incident light is split into two components polarized perpendicularly to each other and, by applying a periodic electric voltage, a periodic phase shift is produced between both components. In the Soleil Babinet compensator 24, the phase difference between the two polarized partial beams may be set to a fixed initial value.

For avoiding depolarization effects during reflection at the beam splitter 25, the partial beams leaving the modulator 23 are so oriented that their direction of polarization extends respectively parallel and perpendicularly to the plane of incidence of the beam splitter. The λ/2 plate 22 is oriented at an angle of 45° to these two directions of polarization.

Having entered the measuring head 20, the laser beam 4 is focussed onto the surface of the object 1 to be measured (and the two adjoining objects 1a, 1b, respectively, if relative displacement is to be measured). As the focussed light passes a birefringent plate 27, it is split into two parallel light beams 6, 7 in accordance with FIG. 1, the mutual spacing of which is a function of the crystal thickness. Details of the beam guidance in accordance with FIG. 1 are not shown in FIG. 2A. One beam impinges upon one grating and the other upon the other grating. Lens 26 is adapted in such a manner that the focal point of the laser beam on the object covers about 10 grating periods. The light reflected by and diffracted at the gratings is collimated by lens 26 after having been recombined by crystal 27.

For phase measurement, the +1th or the −1th diffraction order is preferably used. Cutting out the desired diffraction order is effected by means of a displaceable pinhole diaphragm 28 arranged in the beam path behind the partially reflecting plate 25. Behind the pinhole diaphragm 28, the reflected exit beam 10 reaches a photodetector 30 through a polarizer 29.

Details of the electrooptical phase compensation in an arrangement in accordance with FIG. 2A are described in German Patent Application No. P 28 51 750. The measuring principle may be described as follows: In the electrooptical modulator the linearly polarized light of laser 21 is split into two partial beams polarized perpendicularly to each other; depending upon the magnitude of the voltage applied to modulator 23, one component is delayed with respect to the component polarized perpendicularly thereto. The two perpendicular partial beams reach the birefringent crystal 27 as ordinary and extraordinary beams, respectively, being subject to different phase shifts upon reflection at the grating structures on object 1. Thus, the two partial beams polarized perpendicularly to each other in the exit beam 10 are combined to form linearly, elliptically or circularly polarized light, depending upon the magnitude of the relative phase shift. Since the analyzer 29 is arranged crosswise relative to the linear direction of polarization it will pass no, little or much light to detector 30.

By applying a periodic voltage to the electrooptical light compensator 23 it is possible to determine the voltage and phase difference, respectively, which are necessary to compensate for the phase shift caused by reflection of the partial beams at gratings displaced relative to each other. The zero passage of the detector signal corresponds to this compensating phase shift.

Figure 2B:
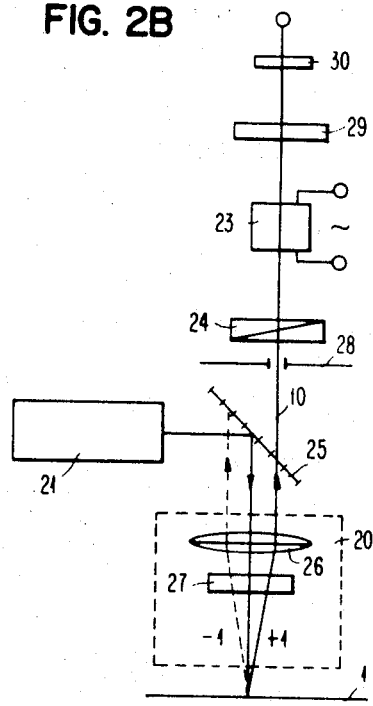

For this purpose, phase compensation may be effected both on the illumination side and in the exit beam. In the partial FIGS. 2A and 2B, identical components bear the same reference numerals. FIG. 2B shows an equivalent embodiment, in accordance with which the electrooptical light modulator 23 and the Soleil Babinet compensator 24 are connected between splitter plate 25 and analyzer 29. Laser beam 4 from laser 21 reaches measuring head 20 directly via beam splitter 25.

Figure 3:
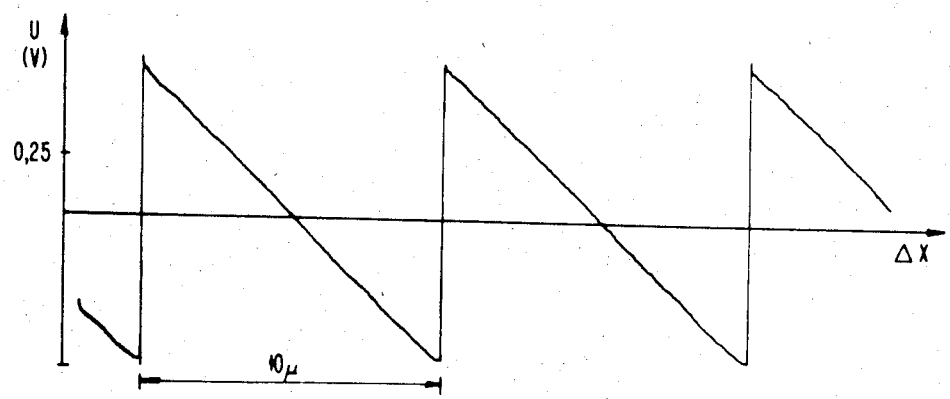
FIG. 3 is the output signal of an electrooptical phase compensator used in the embodiments of FIGS. 2A and 2B.

The output signal of the electrooptical compensation arrangement in accordance with FIGS. 2A and 2B is shown in FIG. 3. The output signal (the compensation voltage U which is a linear function of the phase difference) rises linearly with the displacement of the two gratings relative to each other, so that a sawtooth curve with the grating period g (in the example g=10 μm) is obtained. With the linear curve of this voltage, interpolation between two intermediate values can be effected very accurately.

Unequivocal measurement of the phase difference $\phi_m$ of the two beams polarized perpendicularly to each other and diffracted at the staggered gratings is possible in the range $$-\pi < \phi_m < \pi. \quad (2)$$

This corresponds to a displacement $\Delta X$ of the two gratings relative to each other by $$-g/2 < \Delta X < +g/2. \quad (3)$$

Generally, the relation between the phase shift $\phi_m$ and the grating displacement $\Delta X$ causing this phase shift is given by $$\Delta X = \phi_m \frac{g}{2\pi}, \text{ where } g = \text{grating constant.} \quad (4)$$

As a result of the linear course of the output signal the phase resolution α of the above-described electrooptical phase measuring method is better than $$\alpha \phi = \frac{6}{1000} \pi.$$

When a grating with a grating constant g=6 μm is used, a measuring resolution for the stagger of the two gratings of $$\alpha_X = 0.02 \ \mu m$$

is obtained in accordance with equation (4).

The measuring range is $(\Delta X) < 3$ μm.

For measuring, the two objects 1a, 1b provided with gratings (and object 1 with two gratings, respectively) are initially positioned in such a manner that both split laser beams are initially directed onto the same grating (for example, grating 2). In this position there may also be a phase difference, for example, as a result of the inclination of the object surface or a rotation of the object. This phase difference is measured and phase matching is effected by means of the Babinet compensator, so that the resulting phase difference is 0. Then, the two partial beams are directed onto the gratings 2, 3 by lateral displacement or by the introduction of an inclined parallel glass plate. The phase difference subsequently measured corresponds to the stagger of the two gratings.

For this measuring method it is presumed that there is no height difference between the two gratings. Alternatively, it is necessary to first determine the height difference, as this causes an additional phase difference. For this purpose, the directly reflected light beams (zeroth diffraction orders) can be used which can be selected by a corresponding displacement of the pinhole diaphragm 28. In a first step, both beams 6, 7 are directed onto the same grating and the phase difference is made to be zero; the height difference is determined in a second measuring step in which the beams 6, 7 are directed onto different gratings.

The phase shift between different diffraction orders occurring during the movement of a grating may also be used for a highly precise, absolute length measurement with electrooptical compensation. The phase difference between two neighbouring diffraction orders (e.g., the zeroth and the first) changes when the grating is shifted relative to the illuminating laser beam in accordance with equation (4) explained above for two gratings. The determination of this phase difference by means of the compensation method explained above leads to a resolution of better than 1/1000 grating constant.

Figure 4A:
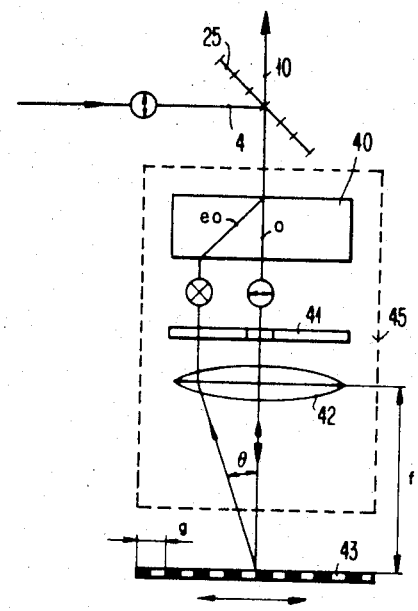
FIGS. 4A, B, and C are schematic diagrams of three embodiments of a measuring head for the absolute determination of the lateral displacement of a grating.
Figure 4B:
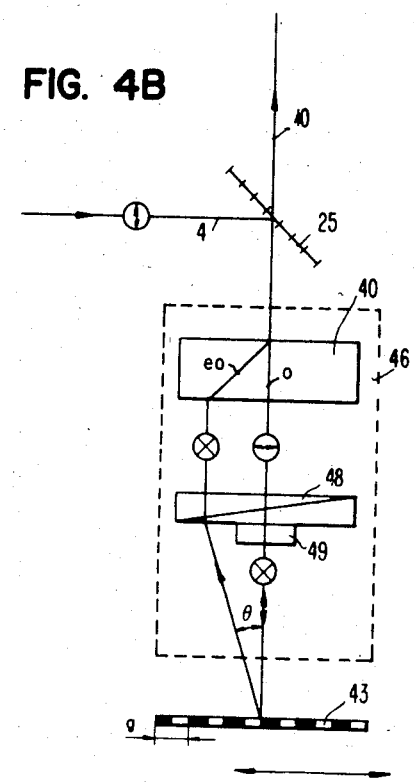

FIGS. 4A and 4B show two embodiments of measuring heads 45 and 46, respectively, by means of which an exit beam 10 can be generated, whose two partial beams polarized perpendicularly to each other have an electrooptically determinable phase difference. For effecting the measurement, a tiny grating scale 43 is applied to the object whose displacement is to be measured, or to a table to which the object is fixed. This grating, which for practical reasons should have a grating constant g of several μm, is perpendicularly illuminated by means of a linearly polarized laser beam 4. The reflected light beams in the zeroth diffraction order (m=0) and in the first diffraction order (m=1) are combined in the form of an exit beam 10 by birefringent optical components.

In FIG. 4A the illumination beam 4 initially impinges on the birefringent crystal 40; the direction of polarization of the beam 4 corresponds to that of the ordinary beam (0) in the birefringent crystal 40, so that there is no beam deflection. Subsequently, the ordinary beam, through a center opening in a λ/2 plate 41 and the center of lens 42, reaches grating 43 where it is diffracted. The lens 42 is spaced by its focal width from grating 43. The focal spot covers several grating periods. The nondiffracted light (diffraction order m=0) is perpendicularly reflected, returning as an ordinary beam to birefringent crystal 40. The light diffracted in the first order is reflected at an angle θ, collimated by lens 42, and its plane of polarization is rotated by 90° in λ/2 plate 41. Thus, it reaches the birefringent crystal 40 as an extraordinary beam. At crystal 40 it is diffracted, and at the exit of said crystal it is combined with the ordinary beam to form exit beam 10, which thus has two components that are polarized perpendicularly to each other and which, depending upon the displacement of grating 43, have a greater or smaller relative phase difference. Measurement of this phase difference by electrooptical compensation in an arrangement in accordance with FIG. 2B again leads to a sawtooth output signal in accordance with FIG. 3. (The evaluation system of FIG. 2A cannot be used in this case, since the entry beam 4 would have two directions of polarization which would be split in the birefringent crystal). The thickness of the birefringent crystal 40 is selected in accordance with the diffraction angle $\theta$ in such a manner that the required beam recombination occurs at its exit face.

FIG. 4B shows a measuring head 46 which operates in the same manner as that of FIG. 4A. A Rochon prism 48 and a $\lambda/2$ plate 49 are arranged between birefringent crystal 40 and grating 43, the plate 49 being passed only by the incident and the perpendicularly reflected light. After its direction of polarization has been repeatedly rotated by 90° in $\lambda/2$ plate 49, the perpendicularly reflected beam of the zeroth order passes the Rochon prism and the birefringent crystal 40 undeflected. However, the first diffraction order, which makes an angle $\theta$ with the optical axis, retains its direction of polarization, passing the Rochon prism 48 as an extraordinary beam. The deflection angle of the Rochon prism is chosen to equal the diffraction angle $\theta$, so that the beam exiting from the Rochon prism is parallel to the optical axis, entering the birefringent crystal 40 as an extraordinary beam. If the thickness of crystal 40 is suitably chosen, the two beams leave crystal 40 as an exit beam 10 with a phase difference corresponding to the displacement of grating 43.

Figure 4C:
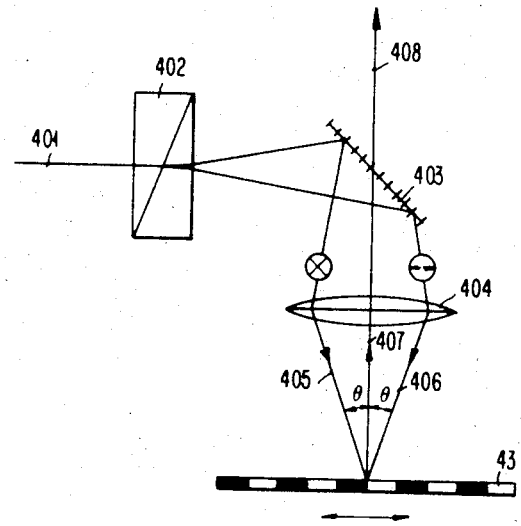

A further embodiment of a measuring head for measuring lateral grating displacements is shown in FIG. 4C; this measuring head has an increased sensitivity. The beam 401 of a laser impinges on a Wollaston prism 402, being split into two perpendicularly polarized partial beams which, after reflection at a beam splitter 403 and passage through a lens 404, impinge as beams 405 and 406 upon the measuring grating 43 at an angle of incidence $\theta$. Angle $\theta$ is chosen in accordance with the first diffraction order, so that the +1th and the −1th diffraction order are diffracted perpendicularly to the plane of the measuring grating (i.e., in the direction 407).

The diffraction orders obtained from beams 405, 406 continue to be polarized perpendicularly to each other. At the same grating displacement, said beams have a phase difference corresponding to twice the value specified in equation (4) [equation 4 relates to two neighbouring diffraction orders].

The exit beam 408 leaves the measuring head through beam splitter 403 and can be evaluated in the usual manner.

In the embodiments in accordance with FIGS. 4A–4C, the measuring and the reference beam are generated at the same point of the grating scale by the laser beam impinging upon the grating. As a result, this measuring method is largely insensitive to changes in the diffraction index caused by pressure or temperature fluctuations. In addition, it is insensitive to distance fluctuations of the grating scale relative to the measuring head. The measuring arrangements in accordance with FIGS. 4A–4C can also be used to measure relative displacements in the manner described in accordance with FIG. 1. For this purpose, the measuring point is successively directed onto the gratings, and the relative phase difference for both positions is determined. During this process, slight differences in the height of the grating do not falsify the measuring results for the lateral displacement. The measuring arrangement in accordance with FIG. 5 described below offers the same advantages.

Figure 5:
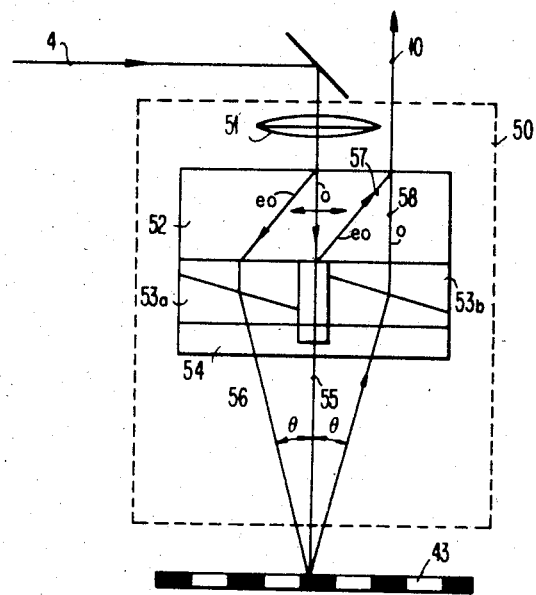
FIG. 5 is a schematic diagram of another measuring head for measuring lateral displacements of a grating.

FIG. 5 illustrates a further embodiment of an optical measuring head 50 with birefringent elements for measuring lateral displacements with the aid of a grating structure arranged on the object to be measured. Its function corresponds to that of the measuring heads shown in FIGS. 4A–4C. The linearly polarized laser beam 4 used for illumination enters the measuring head 50 through lens 51, which is optionally provided, as an ordinary beam.

It then enters a birefringent crystal 52 which passes it undeflected (the extraordinary entry beam (eo) shown in FIG. 5 does not occur in this operating mode). A Wollaston prism 53a, 53b and a $3\lambda/4$ plate 54 are provided between the birefringent crystal 52 and the object to be measured having grating 43 thereon. Along its optical axis, the Wollaston prism is provided with a bore through which the center beam extends; the $3\lambda/4$ plate is thinned out in the same area of the optical axis in such a manner that it acts as a $\lambda/4$ plate for the center beam 55.

The ordinary center beam exiting from the birefringent crystal 52 perpendicularly impinges upon the grating structure 43, and the directly reflected light (in the zeroth diffraction order) returns as a center beam. As beam 55 passes the $\lambda/4$ plate in the center of plate 54 a second time, the plane of polarization of the light of the zeroth diffraction order is rotated by 90°, so that the reflected beam part passes the birefringent crystal 52 as an extraordinary beam 57 and is refracted.

The light of higher diffraction orders leaves grating 43 at an angle $\theta$ according to equation (1), reaching Wollaston prism 53b via the $3\lambda/4$ plate 54. The deflection angle of this Wollaston prism is chosen in such a manner that the angle $\theta$ is just compensated and light of the chosen high diffraction order (preferably the first) will enter the birefringent crystal 52 as a paraxial beam. On its way to grating 43, the light which will be diffracted therefrom passes the $\lambda/4$ plate in the center of plate 54 and, after its reflection from grating 43, passes that part of plate 54 which corresponds to a $3\lambda/4$ plate. Thus, this diffracted light has passed one $\lambda$ plate, so that the plane of polarization is not rotated and beam 58 again enters the birefringent plate 52 as a non-deflected beam. The thickness of plate 52 is chosen so that at its exit beams 57 and 58 form a common exit beam 10 in which the two partial beams, polarized perpendicularly to each other, have a relative phase difference corresponding to the displacement of grating 43.

The measuring head 50 shown in FIG. 5 can also be used, without changing its design, for implementing a measuring method for vertical length changes or step heights, such as that described in German Patent Application No. P 29 25 117.0. In accordance with that application, the object to be measured, whose surface profile is to be determined, is subjected to two partial beams polarized perpendicularly to each other, whose axes include one angle and which impinge upon a common area of the surface to be tested. The reflected beams are subsequently recombined for forming interferences. In accordance with that patent application, the two partial beams are generated by being split in a birefringent crystal, and are subsequently focussed by a collector lens as center or marginal beams onto the object to be tested. The angle between the two partial beams is a function of the beam split and the focal length of the collector lens. This arrangement has the disadvantage that one partial beam as a center beam must be accurately guided through the collector lens, as otherwise there is no accurately defined angle.

Such stringent requirements with regard to the alignment accuracy are avoided with the measuring head in accordance with FIG. 5 if beams 55 and 56, which occur in the birefringent crystal 52 when a laser beam 4 of a suitable direction of polarization is split, are used as illuminating partial beams. As in the previous example, the ordinary beam part 55 is guided as a center beam, and the extraordinary part (eo) of the illuminating beam 4 is deflected in the birefringent plate 52, reaching the Wollaston prism 53a, where it is again deflected so that it coincides with the center beam 55 at the desired angle $\theta$ on the surface of the object to be measured. At the measuring point, for example, a step, the beam 56 is reflected in accordance with the reflection law and deflected in Wollaston prism 53b to form a paraxial beam. Prior to and after reflection, the beam obliquely incident on object 43 passes that part of plate 54 whose thickness corresponds to a $3\lambda/4$ plate, so that the plane of polarization is rotated by 90°. Thus, beam 58 extends as an ordinary beam through the birefringent plate 52 and is recombined with the perpendicularly reflected center beam 55. As beam 55 passes the $\lambda/4$ plate in the center of plate 54 a second time its plane of polarization is rotated by 90°, so that after reflection beam 55 extends as an extraordinary beam 57 through the birefringent plate 52.

In the arrangement of FIG. 5, the angle $\theta$ between the two beams 55 and 56 is determined only by the characteristics of the birefringent elements 52, 53 which are rigidly connected to each other by mechanical means (for example, by cementation). As a result, the above-mentioned alignment difficulties or changes of the angle during measurement are eliminated.

Figure 6:
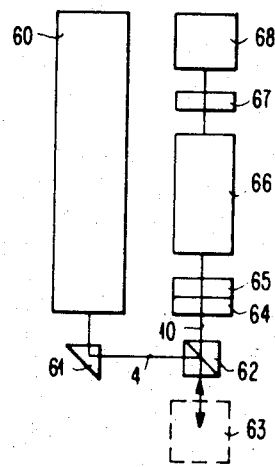
FIG. 6 is a schematic diagram of an electrooptical measuring structure with exchangeable measuring heads.

For the above-described electrooptical measuring heads 20, 45, 46, 50, a single electrooptical measuring device may be used to evaluate the phase difference generated between the two polarized partial beams. FIG. 6 shows the schematic design of such a universal, modular electrooptical measuring device.

The exit beam 4 of a laser 60 is applied via a reflecting mirror 61 to a beam splitter (e.g., cube 62), reaching the respective measuring head inserted in a commonly used fixture 63. The exit beam 10 to be analyzed for its phase difference enters a Babinet Soleil compensator 65 through a pinhole diaphragm 64, and then travels to an electrooptical modulator 66, an analyzer 67 and a detector 68. When the measuring head of FIG. 4C is to be inserted into this measuring device, the beam splitter 62 has to be removed.

The number of measuring heads that can be used in the measuring device of FIG. 6 is not limited to the heads previously described; a plurality of further measuring heads can be connected, such as those described in German Patent Application No. P 28 51 750.2 and the above-mentioned German Patent Application No. P 29 25 117.0. It is essential, however, that two partial beams polarized perpendicularly to each other and having a phase difference influenced by the measuring process, be generated in the respective measuring head. Thus, the measuring arrangement in accordance with FIG. 6 constitutes a versatile measuring means for a very wide range of highly accurate optical measurements, for example, length measurements of a relative or an absolute nature, and the testing of surfaces, such as steps, curvatures, inclinations, edges, etc. Because of the high speed of the compensation method a high measuring speed is obtained and the method can be implemented fully automatically.

For increasing the measuring resolution, it is possible to replace the above-mentioned lower diffraction orders by higher ones. The methods and arrangements proposed herein are also suitable for accurately measuring two-dimensional patterns of interference and moire fringes.

For the sake of brevity, the terms "beams" and "partial beams" in the specification were chosen instead of the more accurate terms "light beams" and "partial light beams".

While the invention has been described in general terms with respect to various embodiments thereof, it will be appreciated by those of skill in the art that other variations consistent with the principles of this invention can be envisioned.

Having thus described my invention, what I claim as new, and desire to secure by Letters Patent is:

1. A method for determining distances optically wherein the phase shift of two light beams upon diffraction from an optical grating is determined, comprising the steps of:
   forming two perpendicularly polarized light beams,
   directing said light beams to at least one optical grating associated with an object whose displacement is to be measured to cause a phase shift between two said light beams,
   combining said light beams after diffraction from said optical grating, the light beams that are combined after striking said optical grating having the same diffraction order, and measuring said phase shift caused by diffraction from said grating, said phase shift being a measure of the displacement of said object.

2. The method of claim 1, wherein said grating is symmetrically illuminated by said two light beams having the same angle of incidence onto said grating, said light beams being perpendicularly polarized with respect to each other, the phase difference between symmetrical diffraction orders of both of said light beams being determined by electrooptical compensation of said phase difference.

3. A method for determining distances optically wherein the phase shift of two light beams upon diffraction from an optical grating is determined, comprising the steps of:
   forming two perpendicularly polarized light beams,
   directing said light beams to at least one optical grating associated with an object whose displacement is to be measured to cause a phase shift between said two light beams,
   combining said light beams after diffraction from said optical grating, and measuring said phase shift caused by diffraction from said grating, said phase shift being a measure of the displacement of said object,
   wherein two optical gratings are associated with said object, said optical gratings being displaceable relative to one another and wherein one of said light beams strikes one of said gratings while the other of said light beams strikes the other grating, said light beams being combined after diffraction from said gratings, the phase difference between said light beams produced by diffraction from said gratings being determined by electroopical compensation of said phase difference to measure the displacement of said two gratings relative to one another.

4. An optical arrangement for determining the relative displacement of one object with respect to another, each of said objects having an optical grating thereon, including:
   means for producing an entry light beam,
   a birefringent plate in the path of said entry light beam for splitting said entry beam into two partial light beams having perpendicularly polarized directions and for recombining said partial light beams after diffraction from said optical gratings,
   means for directing said polarized light beams to said gratings for diffraction therefrom, one of said light beams being diffracted from one of said gratings while the other is diffracted from the other of said gratings,
   electrooptic means for measuring the phase shift between light beams of the same diffraction order diffracted from said two optical gratings, said phase shift being a measure of the relative displacement of said objects with respect to one another.

5. The arrangement of claim 4, including a collector lens located between said source of said entry beam and said birefringent plate for focussing said entry beam onto said optical gratings.

6. An optical arrangement for measuring the displacement of an object, including:
   a source of an entry beam of light,
   a birefringent plate located in the path of said entry beam for splitting said entry beam into two partial beams having perpendicular polarization directions, a $\lambda/2$ plate having a center hole therein through which one of the partial light beams produced by said birefringent plate passes,
   a lens, located between said $\lambda/2$ plate and an optical grating located on the object whose displacement is to be measured, at a distance corresponding to the focal length of said lens,
   electrooptical means for measuring the phase shift of the zeroth and first order light beams diffracted from said optical grating, and
   wherein said birefringent plate has a thickness such that said zeroth and first order light beams diffracted from said optical grating recombine on its exit surface.

7. An optical arrangement for measuring the displacement of an object having an optical grating thereon including:
   a source of an entry light beam,
   a birefringent plate arranged in the path of said entry light beam for splitting said entry beam into two light beams having perpendicular polarization directions,
   a prism and a $\lambda/2$ plate located between said birefringent plate and said object, said split light beam being incident upon said optical grating,
   electrooptic means for introducing a phase shift between the diffracted beam of zeroth and said first order from said optical grating, and
   wherein said zeroth and said first order diffracted beams from said optical gratings pass through said prism and said birefringent plate after diffraction from said optical grating, the thickness of said birefringent plate being chosen such that the diffracted beam of the zeroth order recombine on its exit surface into a single beam.

8. An optical arrangement for measuring the displacement of an object having an optical grating thereon, including:
   a source of an entry beam of light which is linearly polarized and of a single frequency,
   a Wollaston prism located in the path of said entry beam for splitting said entry beam into two light beams having different polarization directions,
   a lens located between said prism and said optical grating for combining said split two light beams at symmetrically identical angles of incidence on said optical grating,
   said angle of incidence corresponding to the diffraction angle of the first order diffracted beams, the diffraction beams of the $+1$th and the $-1$th orders being combined in an exit beam wherein the phase difference between the $+1$th and the $-1$th order is a measure of the displacement of said object.

9. An optical arrangement for measuring the relative displacement between two objects, each of said objects having an optical grating thereon, including:
   a light source for providing an entry light beam,
   a birefringent plate for splitting said input beam into two beams having perpendicular polarization directions,
   a Wollaston prism with a center hole therein, and a $3\lambda/4$ plate with a thinned-out center portion corresponding to a $\lambda/4$ plate, said thinned-out center portion being coaxial with the center hole in said Wollaston prism, wherein the deflection angle of said Wollaston prism is chosen in accordance with the diffraction angle of the first order for light diffracted from said optical gratings, and
   wherein one of said split light beams proceeds through the center hole in said Wollaston prism and the thinned-out center portion of said $3\lambda/4$ plate before striking said optical grating, the other split beam striking said optical grating at an angle corresponding to the diffraction angle of the first order of light diffracted from said grating,
   means including said birefringent plate for combining light diffracted from said grating in said first diffraction order and light which is reflected from said grating through said thinned-out center portion of said $3\lambda/4$ plate and through the center hole of said Wollaston prism, and
   means for measuring the phase shift of said light beams reflected from and diffracted by said grating.

10. The optical arrangement of claim 9, including a collector lens located between said light source and said birefringent plate, and wherein said birefringent plate splits said entry beam into an ordinary beam and an extraordinary beam, the polarization of said entry beam corresponding to the polarization of said ordinary beam in said birefringent plate.

11. An optical arrangement for measuring the displacement of an object, comprising the combination of:
   a light source for providing an entry light beam,
   an object having an optical grating associated therewith, the movement of said grating relating to the movement of said object,
   means for producing two light beams from said entry beam, said two light beams being polarized perpendicularly to each other, means for directing said two light beams to said optical grating for diffraction therefrom, means for combining into a single beam two beams of specified orders of light diffracted from said optical grating the phase difference between said two diffracted light beams being indicative of the displacement of said object, and means for measuring said phase difference including an electrooptical light modulator for splitting a light beam into two components polarized perpendicularly to each other, a compensator for setting to a fixed value the phase difference between the light beams produced by said electrooptical light modulator an analyzer, and a detector which converts input light thereto to an electrical signal indicative of said phase difference.

* * * * *